United States Patent
Sato

(10) Patent No.: US 11,324,108 B2
(45) Date of Patent: May 3, 2022

(54) WIRING SUBSTRATE AND MODULE

(71) Applicant: Murata Manufacturing Co., Ltd., Kyoto (JP)

(72) Inventor: Shota Sato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/171,252

(22) Filed: Feb. 9, 2021

(65) Prior Publication Data

US 2021/0168928 A1 Jun. 3, 2021

Related U.S. Application Data

(63) Continuation of application No. PCT/JP2019/033789, filed on Aug. 28, 2019.

(30) Foreign Application Priority Data

Aug. 31, 2018 (JP) .............................. JP2018-163758

(51) Int. Cl.
*H05K 1/02* (2006.01)
*H05K 1/18* (2006.01)
*H05K 3/28* (2006.01)

(52) U.S. Cl.
CPC ........... *H05K 1/0204* (2013.01); *H05K 1/181* (2013.01); *H05K 3/284* (2013.01)

(58) Field of Classification Search
CPC .......... H05K 1/02; H05K 1/0204; H05K 1/18; H05K 1/181–187; H05K 3/28; H05K 3/284; H05K 2201/0379; H05K 2201/0382; H05K 2201/1327; H01L 23/12

USPC ........................ 361/760–767, 790, 794–795; 174/259–268

See application file for complete search history.

(56) References Cited

U.S. PATENT DOCUMENTS

| | | | | |
|---|---|---|---|---|
| 5,468,997 A | * | 11/1995 | Imai | H01L 23/5383 257/723 |
| 7,260,890 B2 | * | 8/2007 | White | H01L 27/08 228/180.1 |
| 7,402,758 B2 | * | 7/2008 | Mattix | H05K 1/115 174/262 |
| 7,721,427 B2 | * | 5/2010 | Enomoto | H05K 3/4617 29/852 |

(Continued)

FOREIGN PATENT DOCUMENTS

| | | |
|---|---|---|
| CN | 102484950 A | 5/2012 |
| JP | H05-62051 U | 8/1993 |

(Continued)

OTHER PUBLICATIONS

International Search Report issued in Application No. PCT/JP2019/033789, dated Nov. 19, 2019.

(Continued)

*Primary Examiner* — Tuan T Dinh
(74) *Attorney, Agent, or Firm* — Pearne & Gordon LLP

(57) ABSTRACT

A module (101) includes a substrate (1) having a main surface (1a) and a conductor column (4) disposed on the main surface (1a). The conductor column (4) includes a conductor column body (4a) and an overhanging part (4b) overhanging from an outer periphery of the conductor column body (4a) in a middle of a height direction of the conductor column body (4a).

9 Claims, 12 Drawing Sheets

(56) References Cited

U.S. PATENT DOCUMENTS

| | | | |
|---|---|---|---|
| 8,020,292 B1* | 9/2011 | Kumar | H05K 3/4617 |
| | | | 29/852 |
| 2007/0246254 A1* | 10/2007 | Kumar | H05K 3/4617 |
| | | | 174/264 |
| 2010/0027228 A1* | 2/2010 | Tsukada | H01L 24/01 |
| | | | 361/772 |
| 2012/0145445 A1 | 6/2012 | Arai et al. | |
| 2013/0014982 A1* | 1/2013 | Segawa | H05K 1/141 |
| | | | 174/263 |
| 2013/0050957 A1* | 2/2013 | Ogawa | H05K 1/186 |
| | | | 361/728 |
| 2013/0215586 A1 | 8/2013 | Furusawa et al. | |
| 2015/0257281 A1* | 9/2015 | Kao | H05K 3/10 |
| | | | 174/262 |

FOREIGN PATENT DOCUMENTS

| | | |
|---|---|---|
| JP | H0629666 A | 2/1994 |
| JP | 2003198213 A | 7/2003 |
| JP | 4706929 B2 | 6/2011 |
| WO | 2011024790 A1 | 3/2011 |

OTHER PUBLICATIONS

Written Opinion issued in Application No. PCT/JP2019/033789, dated Nov. 19, 2019.

* cited by examiner

WIRING SUBSTRATE AND MODULE

CROSS REFERENCE TO RELATED APPLICATION

This is a continuation of International Application No. PCT/JP2019/033789 filed on Aug. 28, 2019 which claims priority from Japanese Patent Application No. 2018-163758 filed on Aug. 31, 2018. The contents of these applications are incorporated herein by reference in their entireties.

BACKGROUND OF THE DISCLOSURE

Field of the Disclosure

The present disclosure relates to a wiring substrate and a module.

Description of the Related Art

Japanese Patent No. 4706929 (Patent Document 1) discloses a composite wiring substrate in which resin layer sections are formed on both sides of a ceramic substrate body. The resin layer sections are structures including a plurality of resin layers. A columnar conductor is formed so as to penetrate inside the resin layer sections. The columnar conductor has a multi-stage structure in which a plurality of conductor parts is overlapped. Each of the conductor parts has a substantially truncated cone shape. Patent Document 1 discloses that this columnar conductor can be used for heat dissipation.
Patent Document 1: Japanese Patent No. 4706929

BRIEF SUMMARY OF THE DISCLOSURE

When a columnar conductor is used for heat dissipation, the heat dissipation depends on a surface area of the columnar conductor. Thus, sufficient heat dissipation cannot be obtained in some cases depending on a size of the columnar conductor.

It is therefore an object of the present disclosure to improve the heat dissipation in a wiring substrate and a module.

In order to achieve the above object, a wiring substrate of the present disclosure includes a substrate having a main surface and a conductor column disposed on the main surface, in which the conductor column includes a conductor column body and an overhanging part overhanging from an outer periphery of the conductor column body in a middle of a height direction of the conductor column body.

Further, the module of the present disclosure includes the above wiring substrate.

In the present disclosure, the conductor column includes the overhanging part, the heat transmitted to the conductor column can be efficiently dissipated to the surroundings, and thus the heat dissipation of the wiring substrate and the module can be improved.

DETAILED DESCRIPTION OF THE DISCLOSURE

Figure 1:
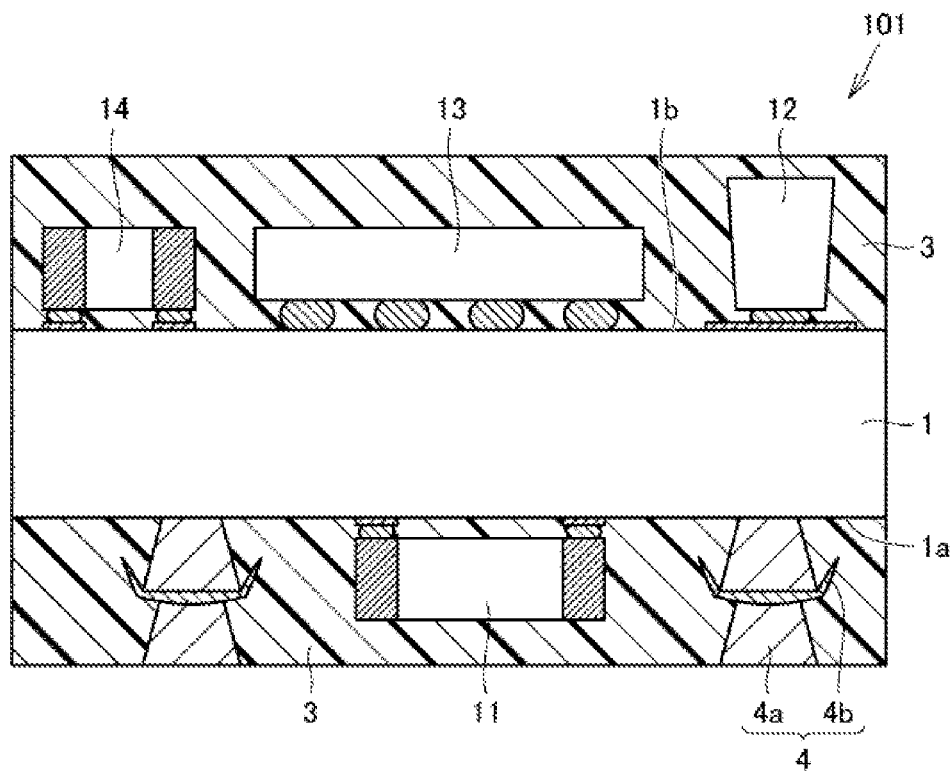
FIG. 1 is a sectional view of a module according to a first embodiment of the present disclosure.

Dimensional ratios shown in the drawings do not always precisely represent the actual dimensional ratios, and may be exaggerated for convenience of explanation. In the following description, when the concept of up or down is referred to, the concept does not always mean absolute up or down but relative up or down in the illustrated posture in some cases.

First Embodiment

Figure 2:
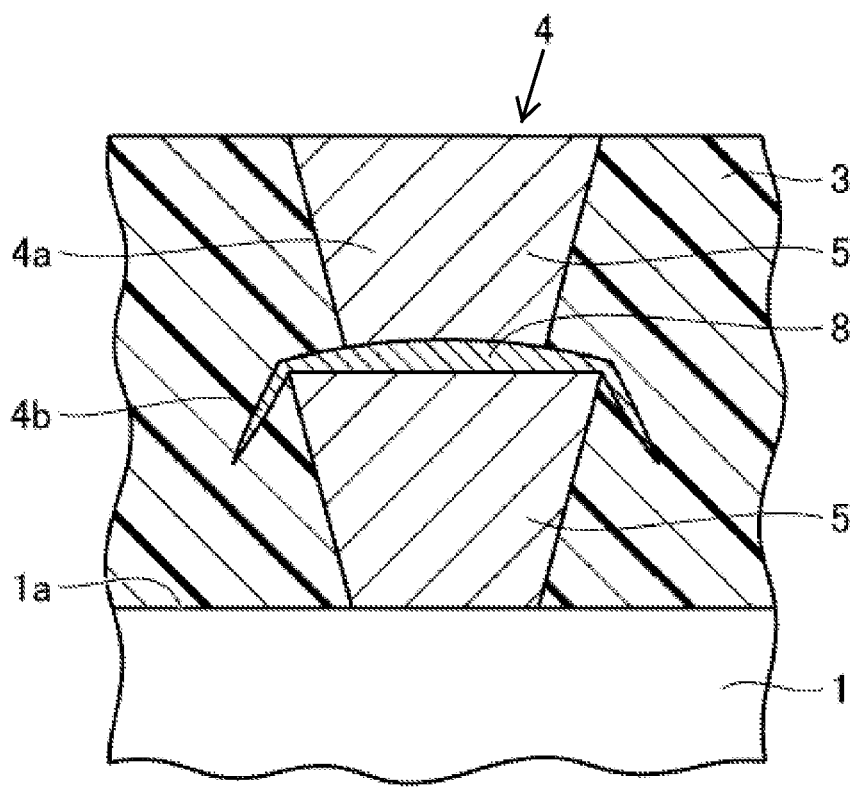
FIG. 2 is a partial enlarged view in which a conductor column in FIG. 1 and its vicinity are extracted.

A module according to a first embodiment of the present disclosure will be described with reference to FIGS. 1 to 4. FIG. 1 is sectional view of a module 101 according to the present embodiment. FIG. 2 is a partial enlarged view of the module 101. In FIG. 2, a conductor column 4 and its vicinity in FIG. 1 are extracted and shown upside down. Hereinafter, a part of the module is referred to as a "wiring substrate". A combination of an electronic component and sealing resin with the wiring substrate is called the "module".

Figure 3:
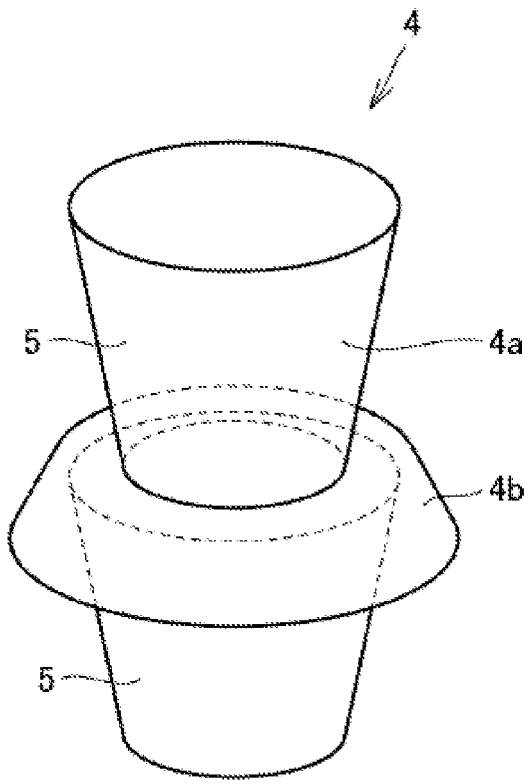
FIG. 3 is a perspective view of the conductor column provided in the module according to the first embodiment of the present disclosure.
Figure 4:
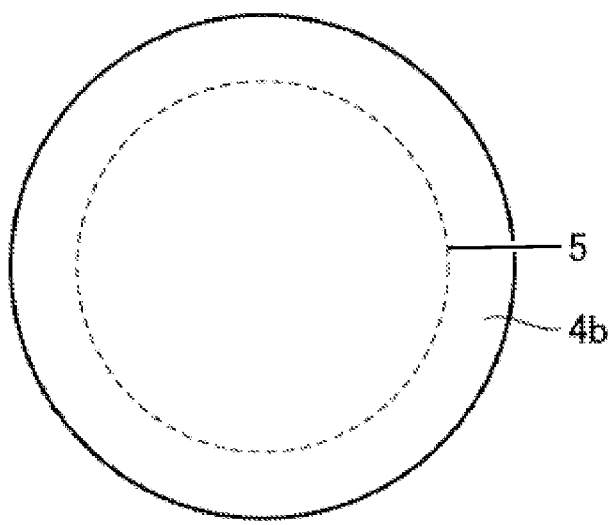
FIG. 4 is a plan view of the conductor column provided in the module according to the first embodiment of the present disclosure.

The module 101 includes a wiring substrate. This wiring substrate includes a substrate 1 having a main surface 1a and a conductor column 4 disposed on the main surface 1a so as to protrude from the main surface 1a. The conductor column 4 includes a conductor column body 4a and an overhanging part 4b that overhangs outward from an outer periphery of the conductor column body 4a in a middle of a height direction of the conductor column body 4a. The conductor column body 4a exemplified here includes two conductor parts 5. The two conductor parts 5 are stacked so as to sandwich a conductor sheet 8 therebetween. The conductor column body 4a includes a part of the conductor sheet 8 other than the overhanging part 4b and the two conductor parts 5. FIG. 3 is a perspective view in which only the conductor column 4 is extracted. FIG. 4 is a plan view in which the conductor part 5 on a lower side and the conductor sheet 8 disposed on the conductor part 5 on the lower side shown in FIG. 3 are extracted. Each of the conductor parts 5 has a truncated cone shape. The conductor sheet 8 has a circular shape when viewed in a plan view. However, the conductor sheet 8 does not have to be circular, and only has to be substantially circular. When viewed in a plan view, the conductor sheet 8 and the conductor part 5 are disposed concentrically. The conductor sheet 8 may be, for example, a metal foil. The conductor part 5 may include, for example, metal. The conductor part 5 may include, for example, copper or silver.

As shown in FIG. 1, the substrate 1 has a main surface 1b as a surface opposite to the main surface 1a. A component 11 is placed on the main surface 1a. Components 12, 13, and 14 are placed on the main surface 1b. The component 11 is, for example, a capacitor. The component 12 is, for example, an inductor. The component 13 is, for example, an IC. The component 14 is, for example, a capacitor. Types, sizes, shapes, and numbers of components 11, 12, 13, and 14 are described as examples only, and are not limited to those described here. Sealing resin 3 is disposed so as to cover the components placed on the main surface 1a and the conductor column 4. The sealing resin 3 is also disposed on the main surface 1b so as to cover the components. The presence of the sealing resin 3 is not essential. Further, a shield film may be provided to cover the sealing resin 3.

The substrate 1 is a ceramic multilayer substrate. The substrate 1 may be a resin multilayer substrate. The substrate 1 may be provided with wiring inside. The wiring provided inside the substrate 1 is not shown in FIG. 1. Here, an example in which some components are placed on both surfaces of the substrate 1 is illustrated, but this configuration may be such that the components are placed on only one surface.

The conductor column 4 may be for electrical connection with another member outside the module 101. The "another member" referred to here may be, for example, a mother substrate.

The module 101 includes the wiring substrate, electronic components disposed on the wiring substrate, and the sealing resin 3 provided to cover the electronic components and the wiring substrate, and one end of the conductor column 4 is exposed from the sealing resin 3. The electronic components referred to here are, for example, the components 12, 13, and 14.

In the present embodiment, the wiring substrate includes the conductor column 4, and the conductor column 4 includes the overhanging part 4b overhanging outward in an annular shape from the outer periphery of the conductor column body 4a in the middle of the height direction of the conductor column body 4a. This can increase an area of a member for dissipating the heat. As a result, the heat transmitted to the conductor column 4 can be efficiently released to the surroundings. This can improve the heat dissipation.

The overhanging part 4b preferably has an annular shape and is inclined to be closer to the substrate 1 toward an outer side in a radial direction from the conductor column body 4a. In other words, the overhanging part 4b is preferably formed such that a tip of the overhanging part 4b hangs down when viewed in a sectional view with the substrate 1 disposed below as shown in FIG. 2. Adopting this configuration can facilitate the formation of the overhanging part 4b.

Figure 5:
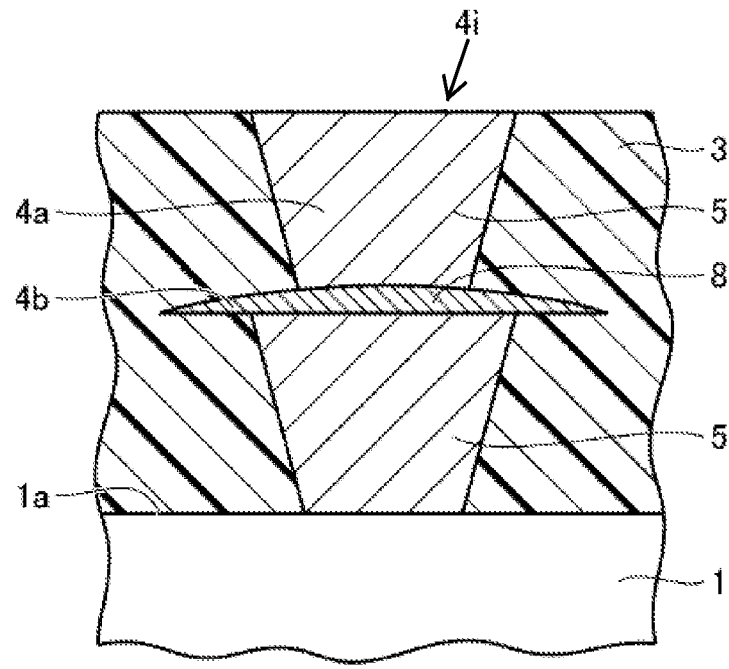
FIG. 5 is a partial enlarged sectional view of a first modification of the module according to the first embodiment of the present disclosure.

As shown in FIG. 5, the overhanging part 4b may have a flat configuration. This wiring substrate includes a conductor column 4i, which includes the overhanging part 4b having a flat shape. The overhanging part 4b extends substantially parallel to the main surface 1a.

Further, contrary to FIG. 2, the overhanging part 4b may be inclined so as to be away from the substrate 1 toward the outer side in the radial direction from the conductor column body 4a.

Figure 6:
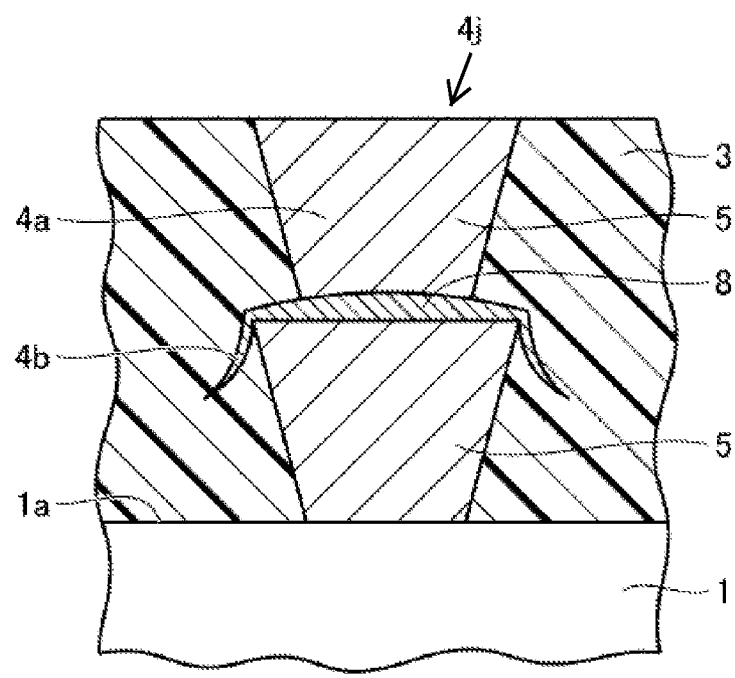
FIG. 6 is a partial enlarged sectional view of a second modification of the module according to the first embodiment of the present disclosure.

As shown in FIG. 6, the overhanging part 4b may be curved while being inclined so as to be closer to the substrate 1 toward the outer side in the radial direction from the conductor column body 4a. This wiring substrate includes a conductor column 4j, which includes the overhanging part 4b that is curved while being inclined. The conductor column 4j has a downwardly convex curved shape in FIG. 6, but may have an upwardly convex curved shape.

As shown in FIG. 1, the module may have the electronic components placed on both sides of the substrate 1. For example, the electronic components include a first component disposed on the main surface of the substrate 1 and a second component disposed on a surface opposite to the main surface of the substrate. The first component is, for example, the components 12, 13, or 14. The second component is, for example, the component 11.

(Method of Manufacturing)

A method of manufacturing for obtaining the module 101 according to the first embodiment will be described with reference to FIGS. 7 to 11.

Figure 7:
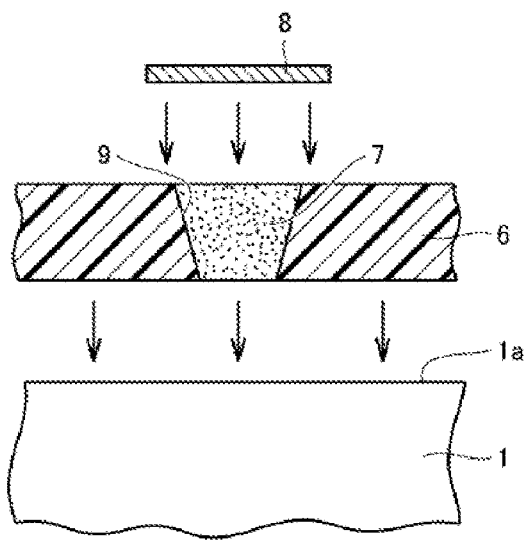
FIG. 7 is an explanatory diagram of a first step of a method of manufacturing the module according to the first embodiment of the present disclosure.
Figure 8:
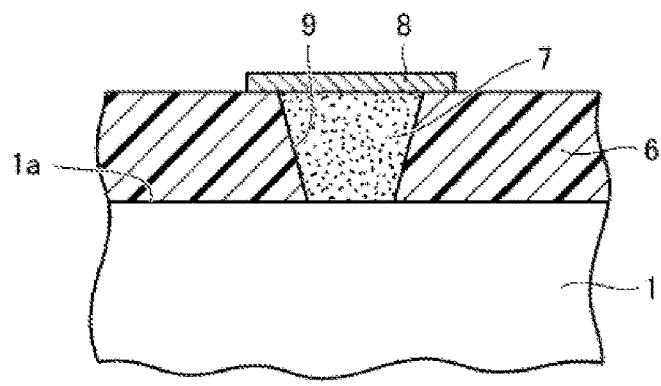
FIG. 8 is an explanatory diagram of a second step of the method of manufacturing the module according to the first embodiment of the present disclosure.
Figure 9:
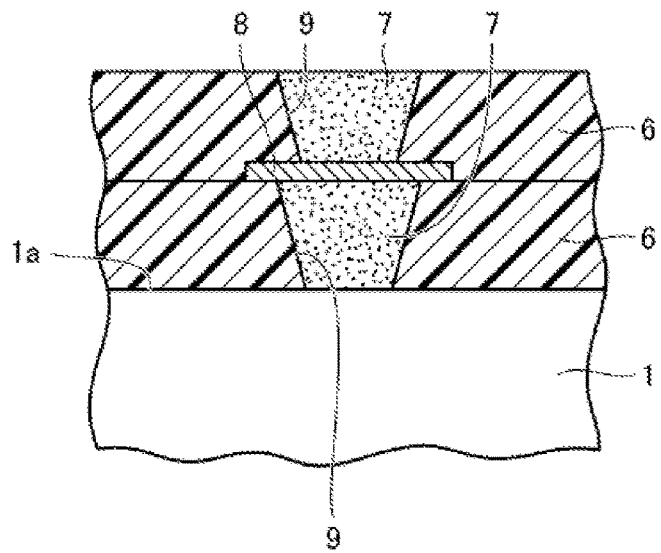
FIG. 9 is an explanatory diagram of a third step of the method of manufacturing the module according to the first embodiment of the present disclosure.
Figure 10:
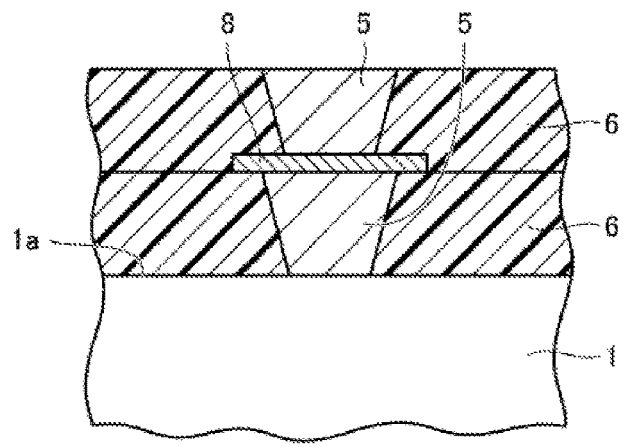
FIG. 10 is an explanatory diagram of a fourth step of the method of manufacturing the module according to the first embodiment of the present disclosure.
Figure 11:
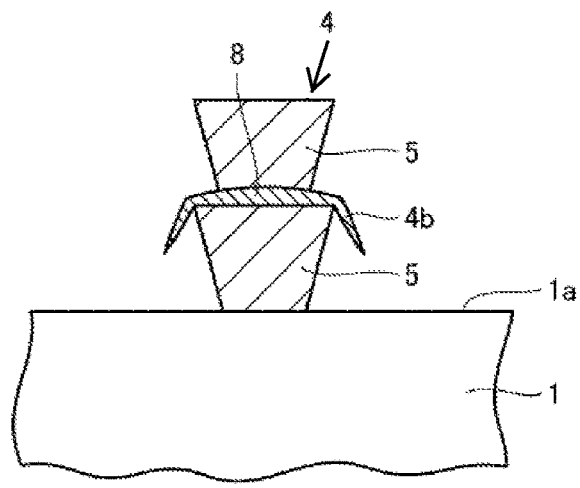
FIG. 11 is an explanatory diagram of a fifth step of the method of manufacturing the module according to the first embodiment of the present disclosure.

As shown in FIG. 7, a conductor column forming sheet 6 is superposed on the main surface 1a of the substrate 1. The conductor column forming sheet 6 is a sheet including, for example, a resin or a non-metal as a material. A through hole 9 is formed in advance in the conductor column forming sheet 6, and the through hole 9 is filled with conductor paste 7. The conductor paste 7 does not have to be cured yet. The conductor paste 7 does not have to be fired yet. The through hole 9 has a truncated cone shape. The through hole 9 has a large diameter at an end far from the substrate 1 and a small diameter at an end near the substrate 1. Then, the circular conductor sheet 8 is superposed so as to cover an exposed part of the conductor paste 7 on an upper surface of the conductor column forming sheet 6. The conductor sheet 8 may be placed after the conductor column forming sheet 6 is placed on the substrate 1. Alternatively, the conductor sheet 8 may be superposed on the conductor column forming sheet 6 in advance for preparation, and the conductor column forming sheet 6 may be placed on the substrate 1. Either case will result in a state shown in FIG. 8.

Further, another conductor column forming sheet 6 is superposed on top. This will result in a state shown in FIG. 9. An outer edge of the conductor sheet 8 protrudes outward from the through hole 9 in an annular shape. By heating this, the conductor paste 7 is cured or fired to become the conductor part 5. This will result in a state shown in FIG. 10. The outer edge of the conductor sheet 8 protrudes outward from the conductor part 5 on a lower side in the drawing in an annular shape. Mechanical processing such as cutting is used to remove the conductor column forming sheet 6. This will result in a state shown in FIG. 11. The conductor column forming sheet 6 is removed by the processing, but the conductor part 5 and the conductor sheet 8 remain. However, the part of the conductor sheet 8 protruding outward from the conductor part 5 is bent downward in FIG. 11 due to an impact of the processing. After that, the sealing resin 3 is arranged around the conductor part 5 and the conductor sheet 8 to reach a state shown in FIG. 2. In order to arrange the sealing resin 3, it is sufficient to perform molding, for example. As a whole, the module 101 as shown in FIG. 1 is obtained.

Figure 12:
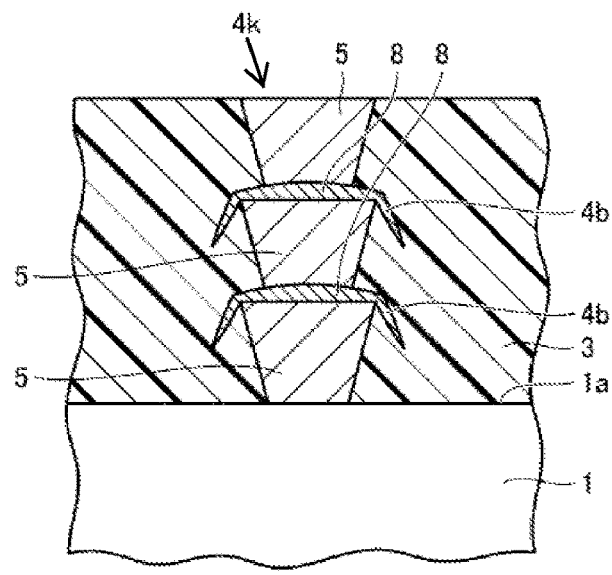
FIG. 12 is a partial enlarged sectional view of a third modification of the module according to the first embodiment of the present disclosure.

Here, the number of the conductor parts 5 stacked is two, but may be three or more. For example, the module may include a conductor column 4k shown in FIG. 12. The conductor column 4k includes three conductor parts 5 and two conductor sheets 8. By appropriately increasing the number of the conductor parts 5 stacked in this way, it is possible to cope with a case where the sealing resin 3 has a large thickness.

Second Embodiment

Figure 13:
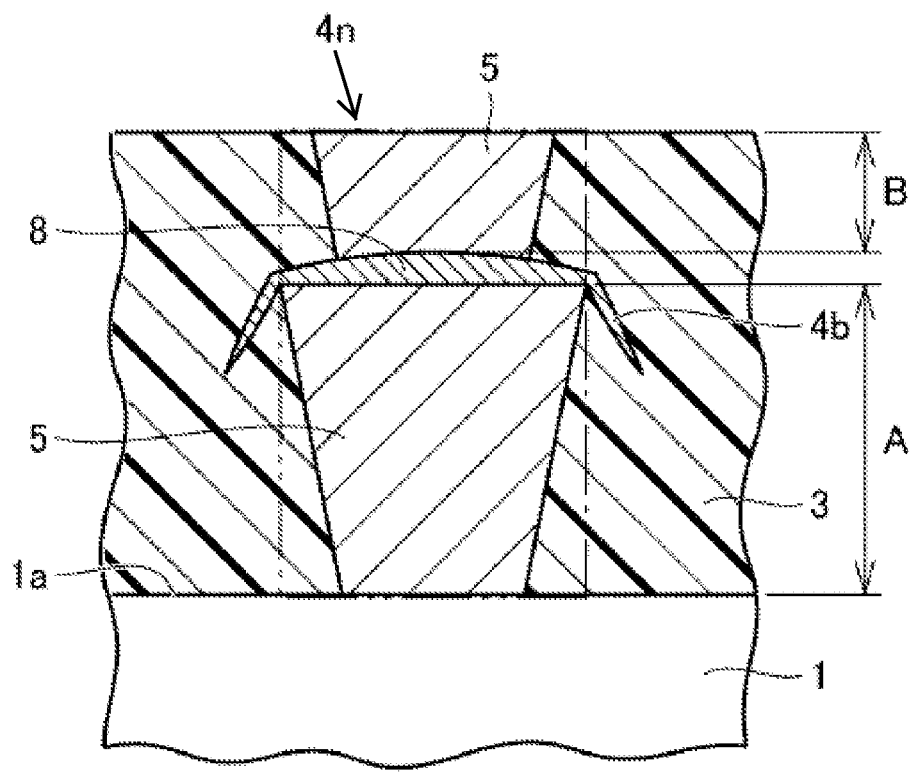
FIG. 13 is a partial enlarged view of a module according to a second embodiment of the present disclosure.
Figure 14:
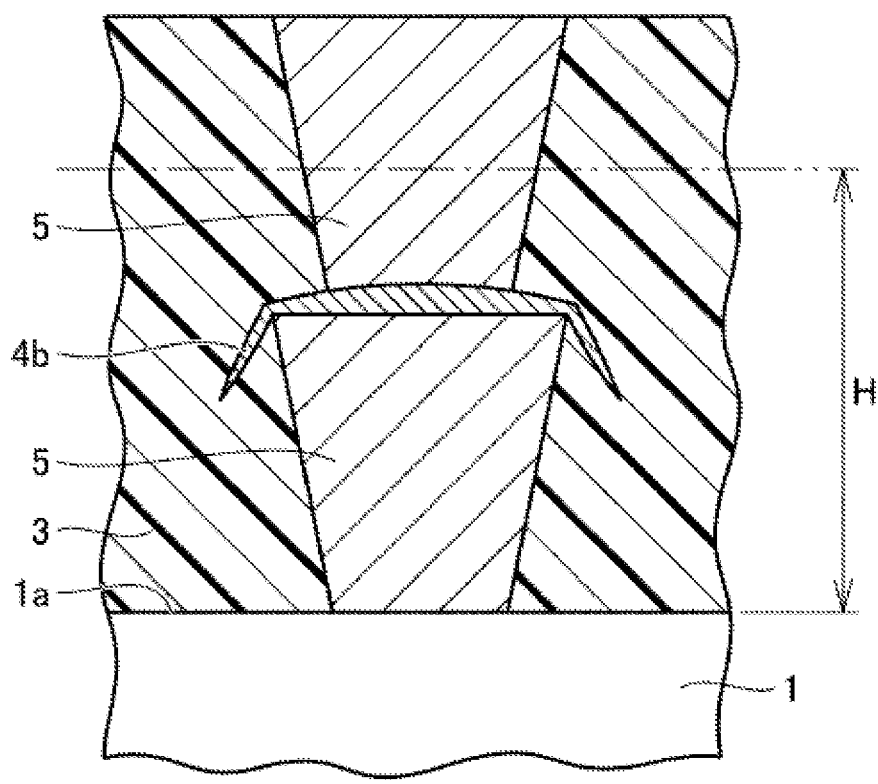
FIG. 14 is an explanatory diagram of a method of manufacturing the module according to the second embodiment of the present disclosure.

A module according to a second embodiment of the present disclosure will be described with reference to FIGS. 13 and 14. The module according to the present embodiment has the same basic configuration as the one described with reference to FIG. 1 in the first embodiment, but a configuration of the conductor column is different from the one in the first embodiment. The module according to the present embodiment includes a conductor column 4n shown in FIG. 13. The conductor column 4n includes two conductor parts 5, and a height of the conductor part 5 on an upper part in the drawing is smaller than that of the conductor part on the lower part in the drawing. The "height" here is a dimension in a direction perpendicular to the main surface 1a. In such a configuration, as shown in FIG. 14, it is sufficient that a structure of the conductor parts 5 having the same height being stacked is first prepared, the sealing resin 3 is disposed, and then, an unnecessary part of the sealing resin 3 and an unnecessary part of the conductor part 5 on the upper part are removed to leave only a required height H. Machine processing such as grinding or polishing can be used for this removal processing.

The height of the stacked conductor parts 5 is almost an integral multiple of the height of the conductor part 5, but the height actually required for the module often does not match the integral multiple of the height of the conductor part 5. In such a case, as described in the present embodiment, the module having a desired height can be accurately obtained by stacking more conductor parts 5 to form the sealing resin 3 having a large thickness and then scraping off a part of an upper surface by the removal processing.

Figure 15:
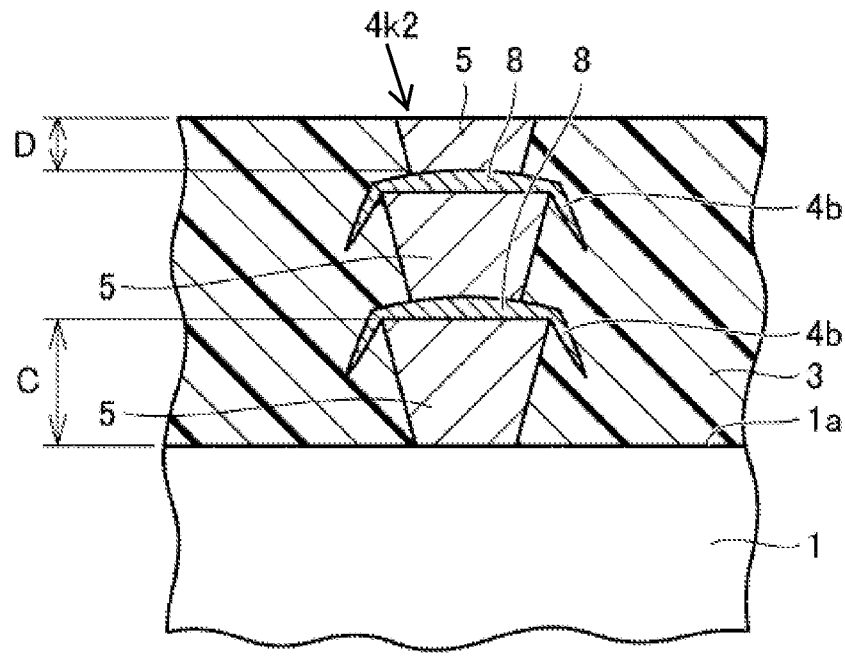
FIG. 15 is a partial enlarged view of a modification of the module according to the second embodiment of the present disclosure.

For example, as shown in FIG. 15, a conductor column 4k2 including three conductor parts 5 is also conceivable. One uppermost conductor part 5 of the three stacked conductor parts 5 has a less height than the other conductor parts 5 as a result of being scraped for height adjustment.

A configuration of the wiring substrate in the present embodiment can also be expressed as follows. The conductor column has a first end and a second end as both ends in the height direction, and the shortest distance in the height direction from the first end to the overhanging part is different from the shortest distance in the height direction from the second end to the overhanging part. Assuming that the first end is a lower end of the conductor column and the second end is an upper end of the conductor column, the shortest distance A in the height direction from the first end to the overhanging part 4b and the shortest distance B in the height direction from the second end to the overhanging part 4b are different in the example shown in FIG. 13. In the example shown in FIG. 15, the shortest distance C in the height direction from the first end to the overhanging part 4b and the shortest distance D in the height direction from the second end to the overhanging part 4b are different.

In the present embodiment, the heat dissipation can be improved as in the first embodiment. Further, in the present embodiment, a height of the wiring substrate as a whole can be adjusted to a desired value by adjusting the height of the conductor part located at an end in a vertical direction by scraping or the like.

As shown in the above embodiments, the conductor column body 4a preferably includes a plurality of conductor parts 5 stacked in the height direction, and the overhanging part 4b is preferably provided at a boundary between the conductor parts 5. This configuration adopted herein can be easily manufactured and promote the heat dissipation.

Note that the overhanging part 4b does not have to be provided at the boundary between the conductor parts 5 at a plurality of locations. At the boundary between the conductor parts 5, there may be a part where the overhanging part 4b is not provided.

Third Embodiment

Figure 16:
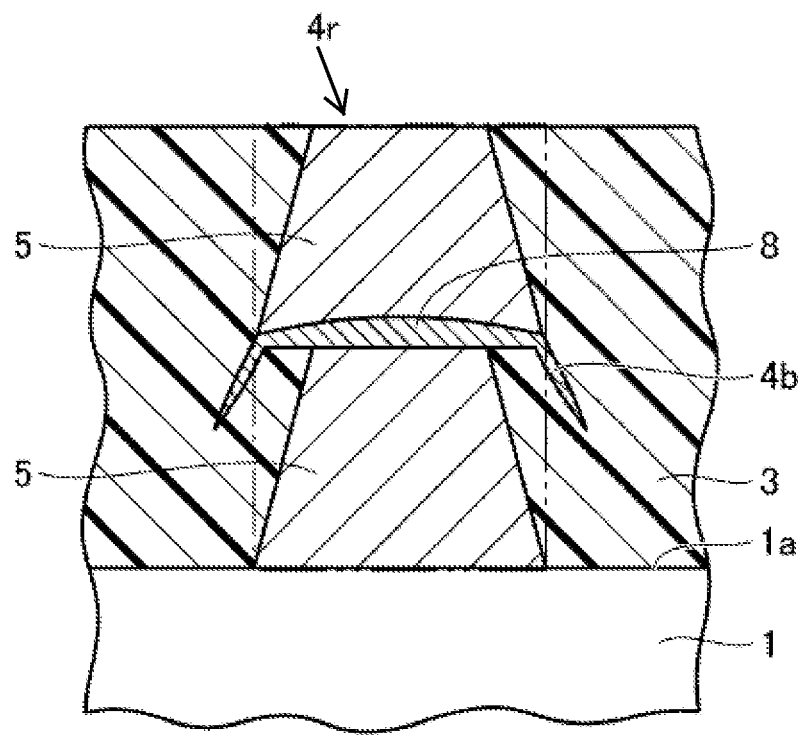
FIG. 16 is a partial enlarged view of a module according to a third embodiment of the present disclosure.

A module according to a third embodiment of the present disclosure will be described with reference to FIG. 16. The module according to the present embodiment has the same basic configuration as the one described with reference to FIG. 1 in the first embodiment, but a configuration of the conductor column is different from the one in the first embodiment. In the module according to the present embodiment, the wiring substrate includes a conductor column 4r shown in FIG. 16. The conductor column 4r includes the plurality of conductor parts 5. For example, the conductor column 4r includes two conductor parts 5. In the first and second embodiments, each conductor part 5 has a truncated cone shape whose diameter increases as being away from the substrate 1. However, in the present embodiment, conversely, each conductor part 5 has a truncated cone shape whose diameter decreases as being away from the substrate 1. In the present embodiment, the part of the conductor sheet 8 overhanging outward from a lower end of the conductor part 5 on the upper side is bent downward as the overhanging part 4b.

Figure 17:
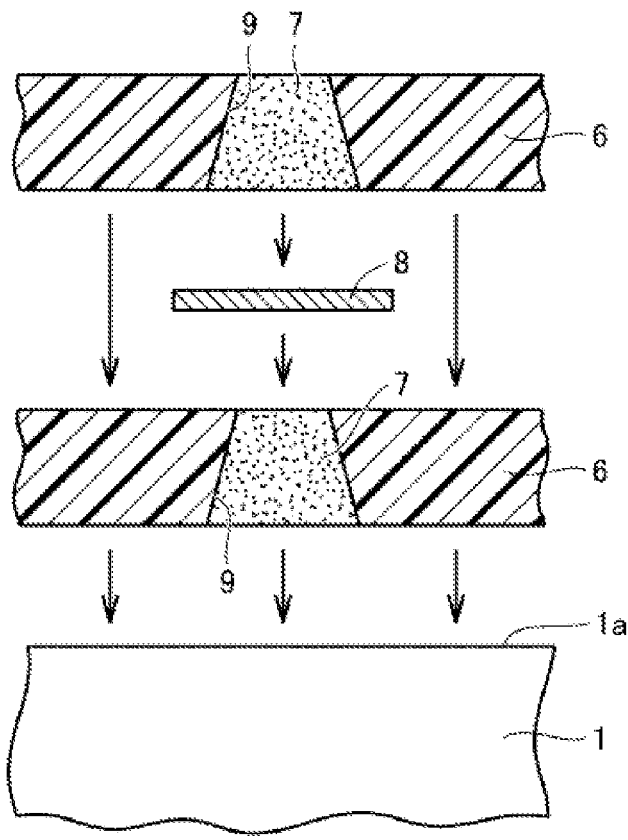
FIG. 17 is an explanatory diagram of a first step of a method of manufacturing the module according to the third embodiment of the present disclosure.

In the present embodiment, a similar effect to that of the first embodiment can be obtained. In order to manufacture the module according to the present embodiment, it is sufficient that the conductor column forming sheet 6 is stacked as shown in FIG. 17. At the time of stacking, a direction of a slope of a tapered shape of the through hole 9 is opposite to that of the first embodiment shown in FIG. 7 and the like. The direction of the slope of the tapered shape of the through hole 9 can be selected depending on which surface of the conductor column forming sheet 6 the through hole 9 is passed through.

Figure 18:
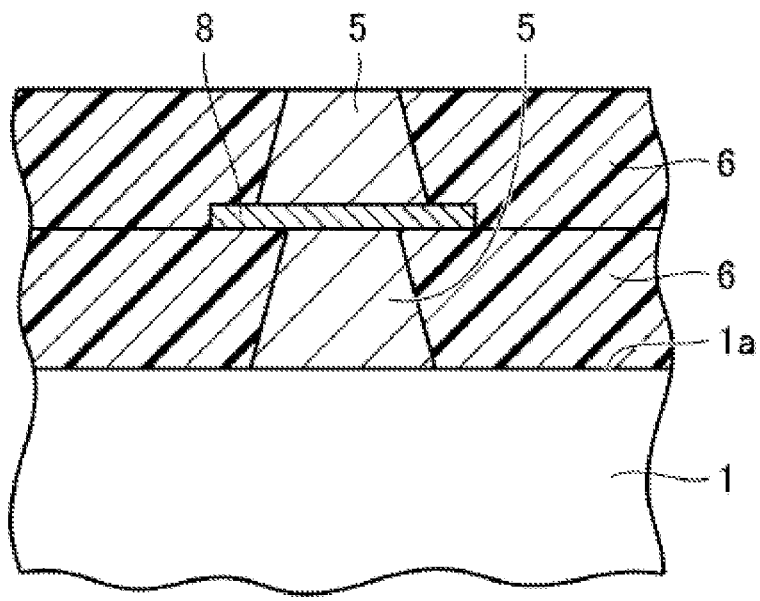
FIG. 18 is an explanatory diagram of a second step of the method of manufacturing the module according to the third embodiment of the present disclosure.
Figure 19:
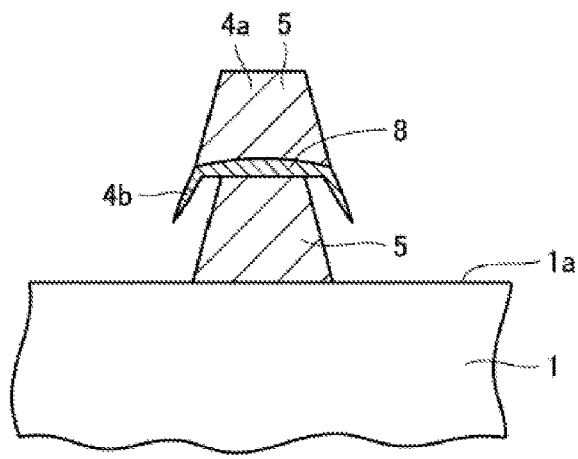
FIG. 19 is an explanatory diagram of a third step of the method of manufacturing the module according to the third embodiment of the present disclosure.

As shown in FIG. 17, the conductor column forming sheet 6 and the conductor sheet 8 are stacked on a main surface 1u of the substrate 1. By heating after stacking in this way, the conductor paste 7 is cured to become the conductor part 5. This will result in a state shown in FIG. 18. The outer edge of the conductor sheet 8 protrudes outward from the conductor part 5 on the upper side in the drawing in an annular shape. Further, the conductor column forming sheet 6 is removed by mechanical processing. This will result in a state shown in FIG. 19. The part of the conductor sheet 8 protruding outward from the conductor part 5 is bent downward in FIG. 19 due to an impact of the processing. After that, the sealing resin 3 is arranged around the conductor part 5 and the conductor sheet 8 to reach a state shown in FIG. 16.

Fourth Embodiment

Figure 20:
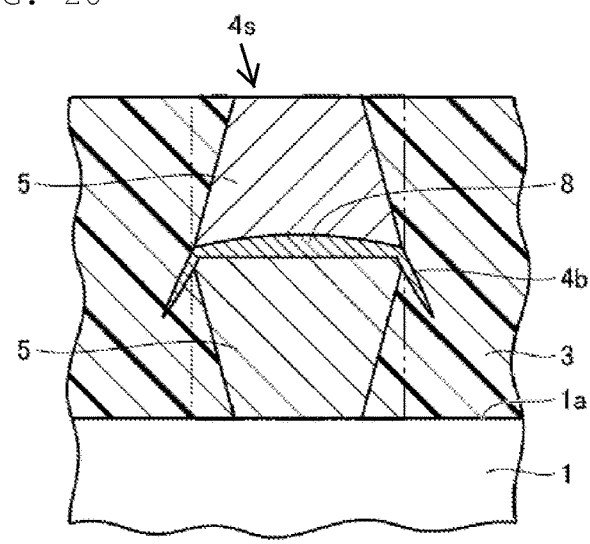
FIG. 20 is a partial enlarged view of a module according to a fourth embodiment of the present disclosure.

A module according to a fourth embodiment of the present disclosure will be described with reference to FIG. 20. The module according to the present embodiment has the same basic configuration as the one described with reference to FIG. 1 in the first embodiment, but a configuration of the conductor column is different from the one in the first embodiment. In the module according to the present embodiment, the wiring substrate includes a conductor column 4s shown in FIG. 20. The conductor column 4s includes the plurality of conductor parts 5. For example, the conductor column 4s includes two conductor parts 5.

In the present embodiment, the plurality of conductor parts 5 includes a first conductor part having a first tapered shape and a second conductor part having a second tapered shape in an opposite direction to the first tapered shape. For example, in the conductor column 4s shown in FIG. 20, the conductor part 5 on the lower side is the first conductor part, and the conductor part 5 on the upper side is the second conductor part. The first conductor part has a tapered shape whose diameter increases as being away from the substrate 1. The second conductor part has a tapered shape whose diameter decreases as being away from the substrate 1. Which conductor part 5 is to be regarded as the first conductor part in one conductor column including the plurality of conductor parts 5 is not always as in the example shown here. The same applies to the second conductor part.

The effect described in the first embodiment can be obtained in the present embodiment.

Figure 21:
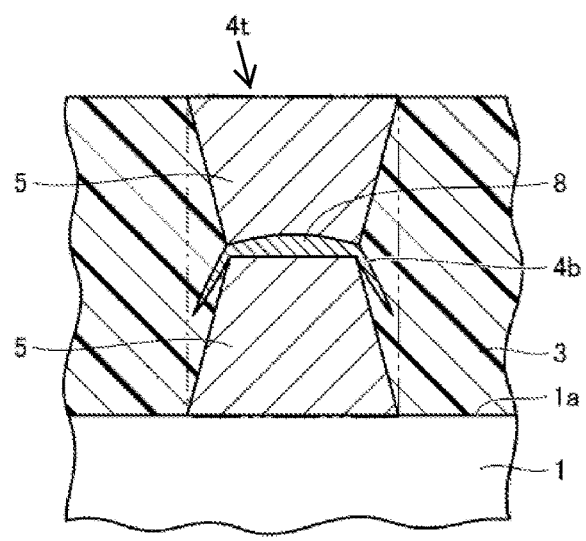
FIG. 21 is a partial enlarged view of a modification of the module according to the fourth embodiment of the present disclosure.

As a modification of the conductor column 4s, a conductor column 4t shown in FIG. 21 may be used. For example, in the conductor column 4t shown in FIG. 21, the conductor part 5 on the lower side is the first conductor part, and the conductor part 5 on the upper side is the second conductor part. The first conductor part has a tapered shape whose diameter decreases as being away from the substrate 1. The second conductor part has a tapered shape whose diameter increases as being away from the substrate 1.

Fifth Embodiment

Figure 22:
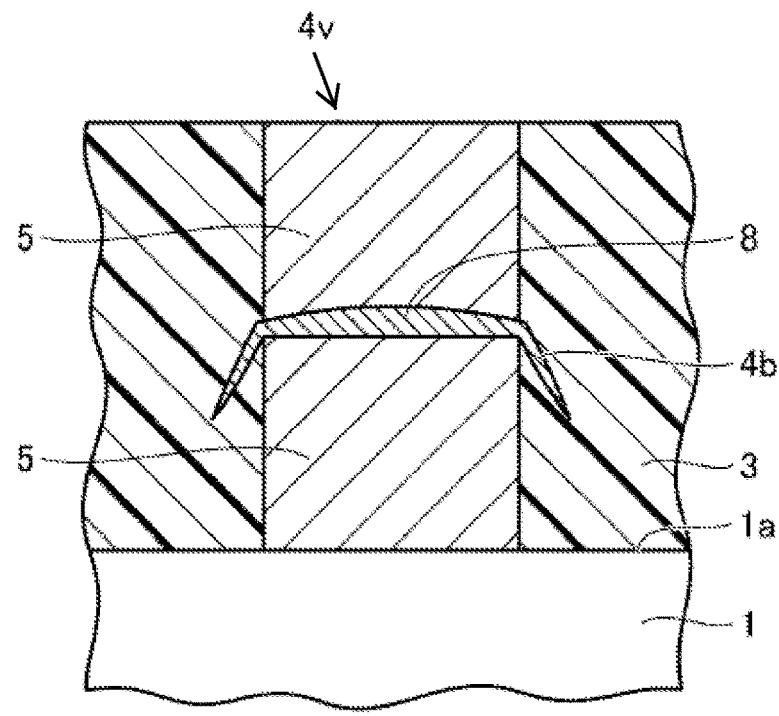
FIG. 22 is a partial enlarged view of a module according to a fifth embodiment of the present disclosure.

A module according to a fifth embodiment of the present disclosure will be described with reference to FIG. 22. The module according to the present embodiment has the same basic configuration as the one described with reference to FIG. 1 in the first embodiment, but a configuration of the conductor column is different from the one in the first embodiment. In the module according to the present embodiment, the wiring substrate includes a conductor column 4v shown in FIG. 22. The conductor column 4v includes the plurality of conductor parts 5. For example, the conductor column 4v includes two conductor parts 5.

Figure 23:
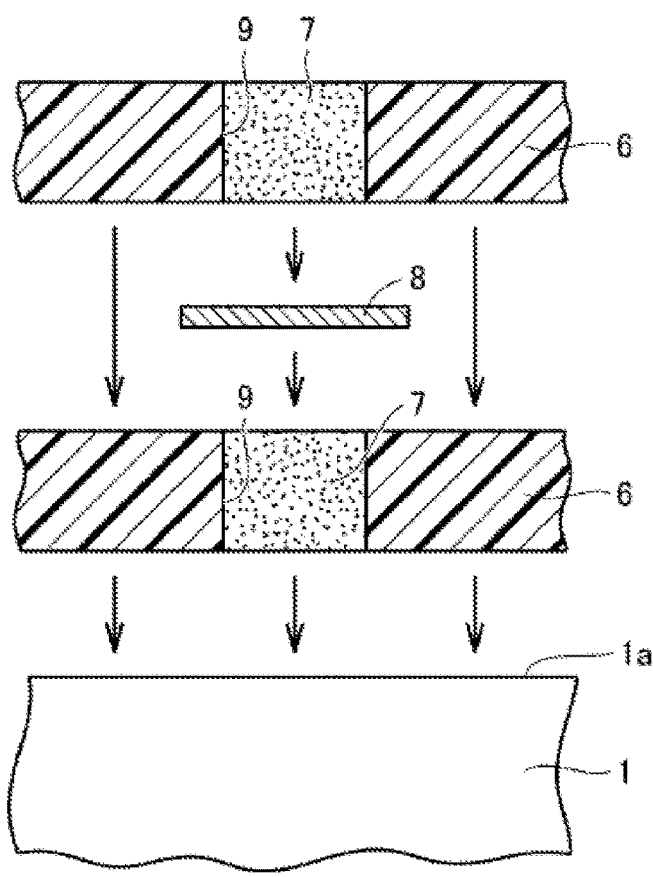
FIG. 23 is an explanatory diagram of a first step of a method of manufacturing the module according to the fifth embodiment of the present disclosure.
Figure 24:
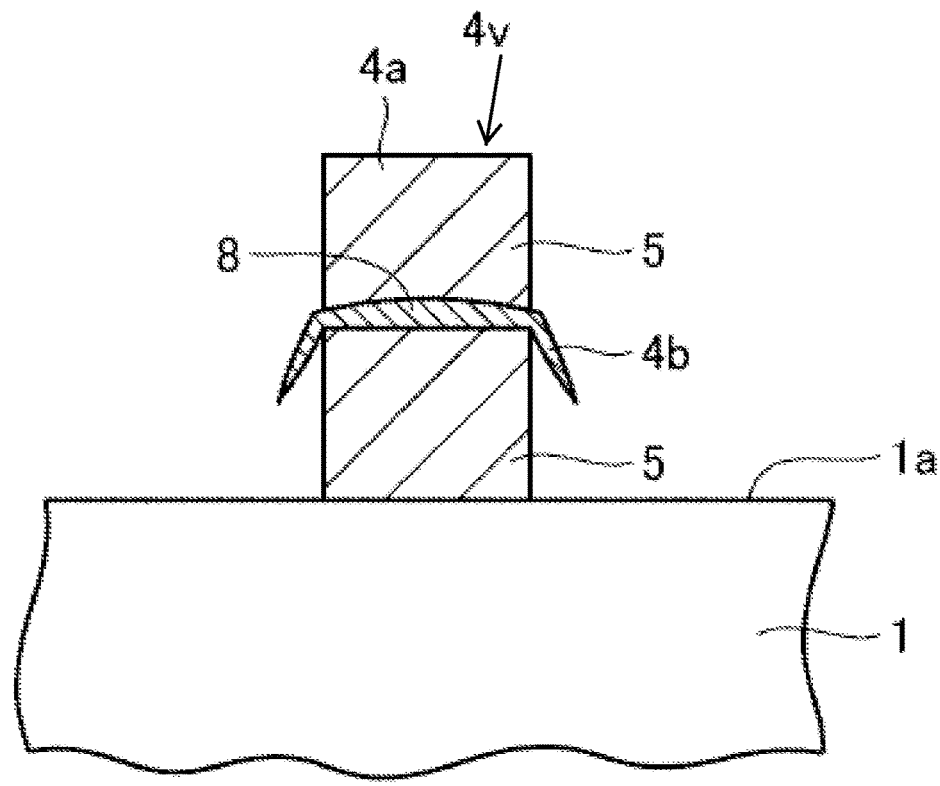
FIG. 24 is an explanatory diagram of a second step of the method of manufacturing the module according to the fifth embodiment of the present disclosure.

In the present embodiment, the plurality of conductor parts 5 includes at least one conductor part 5 having a straight shape. The plurality of conductor parts 5 having a straight shape is stacked, and the overhanging part 4b overhangs outward from the boundary between the conductor parts 5. The conductor column 4v shown in FIG. 22 can be manufactured as shown in FIG. 23. In FIG. 23, the conductor column forming sheet 6 is provided with the through hole 9 having a straight shape, and the through hole 9 is filled with the conductor paste 7. The conductor paste 7 is cured or fired by heating to form the conductor parts 5, and a structure can be obtained by processing in which the conductor parts 5 having a straight shape are stacked and the overhanging part 4b hangs down toward the substrate 1 as shown in FIG. 24. After that, the sealing resin 3 is arranged around the conductor part 5 and the conductor sheet 8 to reach a state shown in FIG. 22.

The effect described in the first embodiment can be obtained in the present embodiment. Here, an example is shown in which the conductor column 4v includes two conductor parts 5, but the number of the included conductor parts 5 may be three or more.

Sixth Embodiment

Figure 25:
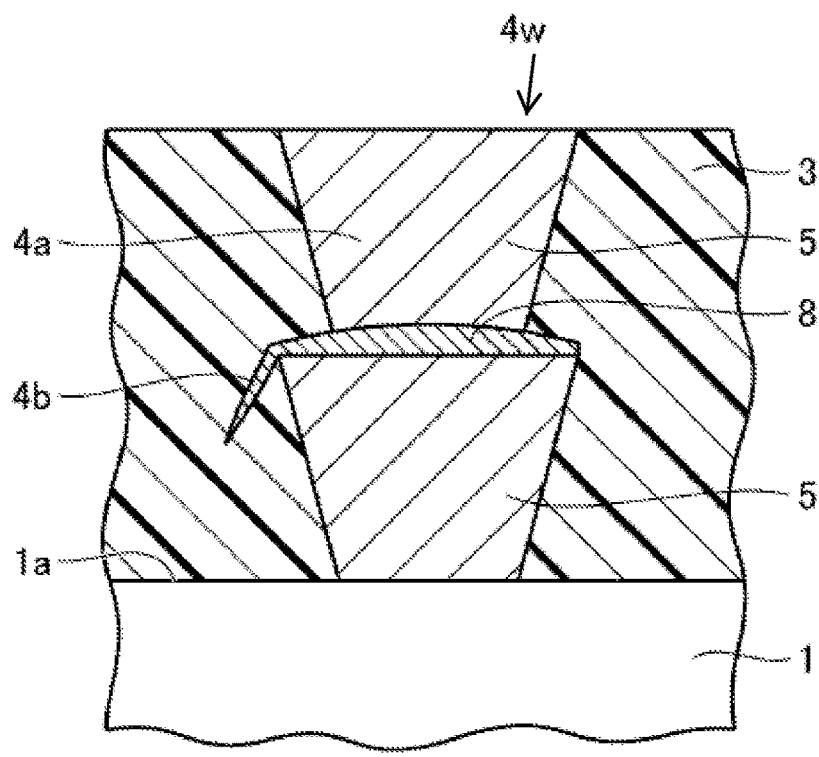
FIG. 25 is a sectional view of a conductor column provided with a module according to a sixth embodiment of the present disclosure.

A module according to a sixth embodiment of the present disclosure will be described with reference to FIG. 25. The module according to the present embodiment has the same basic configuration as the one described with reference to FIG. 1 in the first embodiment, but a configuration of the conductor column is different from the one in the first embodiment. The wiring substrate provided in the module according to the present embodiment includes a conductor column 4w. When viewed in sectional view as shown in FIG. 25, the overhanging part 4b of the conductor column 4w overhangs only on one side. As described above, the overhanging part 4b may be disposed not symmetrically when viewed in the sectional view. The overhanging part 4b does not have to exist in an annular shape around the conductor column body 4a, but may be configured to exist only in a part of the periphery of the conductor column body 4a. The configuration of the overhanging part 4b shown in FIG. 25 is just an example. When viewed by cutting in one cross section, the overhanging part 4b may overhang only on one side, but when viewed by cutting in another cross section, the overhanging part 4b may overhang on both sides.

Seventh Embodiment

Figure 26:
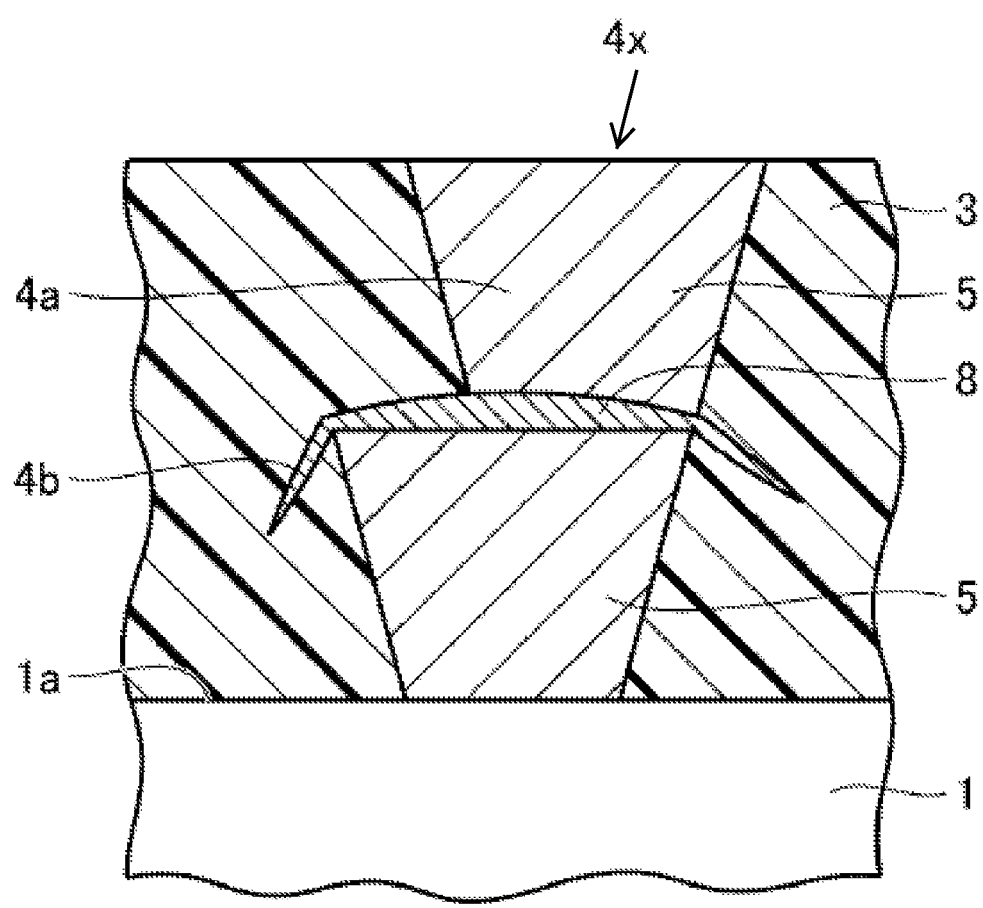
FIG. 26 is a sectional view of a conductor column provided with a module according to a seventh embodiment of the present disclosure.

A module according to a sixth embodiment of the present disclosure will be described with reference to FIG. 26. The module according to the present embodiment has the same basic configuration as the one described with reference to FIG. 1 in the first embodiment, but a configuration of the conductor column is different from the one in the first embodiment. The wiring substrate provided in the module according to the present embodiment includes a conductor column 4x. When viewed in a sectional view as shown in FIG. 26, the center lines of the plurality of conductor parts 5 included in the conductor column 4x do not match. The conductor part 5 on the upper side is stacked on the conductor part 5 on the lower side with the center lines deviated from each other. Such a configuration may be adopted. Here, an example is shown in which one conductor column includes a stack of two conductor parts 5, but the same applies when one conductor column includes a stack of three or more conductor parts 5. The center lines of a part or all of the conductor parts 5 included in the conductor column may be deviated.

Note that a plurality of the above embodiments may be appropriately combined and adopted.

The above embodiments disclosed herein are examples in all respects and are not restrictive. The scope of the present disclosure is shown by the claims, and includes meanings equivalent to the claims and all modifications within the claims.

1: Substrate
1a, 1b: Main surface
3: Sealing resin
4, 4i, 4j, 4k, 4k2, 4n, 4r, 4s, 4t, 4v, 4w, 4x: Conductor column
4a: Conductor column body
4b: Overhanging part
5: Conductor part
6: Conductor column forming sheet
7: Conductor paste
8: Conductor sheet
9: Through hole
11, 12, 13, 14: Component
101: Module

The invention claimed is:

1. A wiring substrate comprising:
a substrate having a main surface; and
a conductor column disposed on the main surface,
wherein the conductor column includes a conductor column body and an overhanging part overhanging from an outer periphery of the conductor column body in a middle of a height direction of the conductor column body,
wherein the overhanging part has an annular shape and is inclined to be closer to the substrate as being headed toward an outer side in a radial direction from the conductor column body, and
wherein the conductor column has a first end and a second end as both ends in the height direction, and a shortest distance in the height direction from the first end to the overhanging part is different from a shortest distance in the height direction from the second end to the overhanging part.

2. The wiring substrate according to claim 1, wherein the conductor column body includes a plurality of conductor parts stacked in the height direction, and the overhanging part is provided at a boundary between the plurality of conductor parts.

3. A module comprising:
the wiring substrate described in claim 1;
an electronic component disposed on the wiring substrate; and
a sealing resin provided to cover the electronic component and the wiring substrate,
wherein one end of the conductor column is exposed from the sealing resin.

4. The wiring substrate according to claim 2, wherein the plurality of conductor parts includes at least one conductor part having a straight shape.

5. The module according to claim 3, wherein the electronic component includes a first component disposed on the main surface of the substrate and a second component disposed on a surface opposite to the main surface of the substrate.

6. A module comprising:
the wiring substrate described in claim 2;
an electronic component disposed on the wiring substrate; and
a sealing resin provided to cover the electronic component and the wiring substrate,
wherein one end of the conductor column is exposed from the sealing resin.

7. A module comprising:
the wiring substrate described in claim 4;
an electronic component disposed on the wiring substrate; and
a sealing resin provided to cover the electronic component and the wiring substrate,
wherein one end of the conductor column is exposed from the sealing resin.

8. A wiring substrate comprising:
a substrate having a main surface; and
a conductor column disposed on the main surface,
wherein the conductor column includes a conductor column body and an overhanging part overhanging from an outer periphery of the conductor column body in a middle of a height direction of the conductor column body,
wherein the overhanging part has an annular shape and is inclined to be closer to the substrate as being headed toward an outer side in a radial direction from the conductor column body, and
wherein the plurality of conductor parts includes a first conductor part having a first tapered shape and a second conductor part having a second tapered shape in an opposite direction to the first tapered shape.

9. A module comprising:
the wiring substrate described in claim 8;
an electronic component disposed on the wiring substrate; and
a sealing resin provided to cover the electronic component and the wiring substrate,
wherein one end of the conductor column is exposed from the sealing resin.

* * * * *